United States Patent [19]

Nunally

[11] Patent Number: 4,887,544
[45] Date of Patent: Dec. 19, 1989

[54] VACUUM WELL PROCESS

[75] Inventor: Patrick O. Nunally, Diamond Bar, Calif.

[73] Assignee: General Dynamics Corp., Pomona Div., Pomona, Calif.

[21] Appl. No.: 167,940

[22] Filed: Mar. 14, 1988

[51] Int. Cl.[4] .............................................. C23C 14/00
[52] U.S. Cl. ..................................... 118/50; 118/402; 118/404; 118/410
[58] Field of Search ..................... 427/97; 118/50, 402, 118/410, 404

[56] References Cited

U.S. PATENT DOCUMENTS

| | | | |
|---|---|---|---|
| 3,004,505 | 10/1961 | Dvorak | 118/410 |
| 3,058,441 | 10/1962 | Walker | 118/410 |
| 3,357,856 | 12/1967 | Ragan et al. | 427/97 |
| 3,589,590 | 6/1971 | Fitzsimmons | 228/37 |
| 3,690,943 | 9/1972 | Papiano | 427/97 |
| 3,724,418 | 4/1973 | McLain | 118/69 |
| 3,948,212 | 4/1976 | Mayer | 118/50 |
| 4,162,034 | 7/1979 | Pavlas | 228/37 |
| 4,301,192 | 11/1981 | Plichta | 427/97 |
| 4,360,144 | 11/1982 | Cuddy et al. | 228/180 |
| 4,383,494 | 5/1983 | Schillke | 118/50 |
| 4,465,014 | 8/1984 | Bajka | 118/410 |
| 4,544,577 | 10/1985 | May | 427/97 |
| 4,563,974 | 1/1986 | Price | 118/404 |
| 4,602,733 | 7/1986 | Slack | 228/242 |
| 4,768,699 | 9/1988 | Abbagnaro | 228/264 |

OTHER PUBLICATIONS

Printed Wiring and Backplace Industry Forecast, Gnostic Concepts, Inc., pp. 6-1 through 6-14, 6-28 through 6-31, 7-9 and 7-10.

Primary Examiner—Shrive Beck
Assistant Examiner—Vi Duong Dang
Attorney, Agent, or Firm—Lawrence A. Maxham; Leo R. Carroll

[57] ABSTRACT

A system and process, including a combination of a solder well and a vacuum system wherein micro through holes are filled with solder. A PC board or the like is supported for contact with solder on one side and with a vacuum apparatus for the application of a vacuum to the other side so that solder is drawn into the through holes for establishing electrically conductive connections therethrough.

10 Claims, 2 Drawing Sheets

VACUUM WELL PROCESS

FIELD OF THE INVENTION

The present invention relates to electronic devices and pertains particularly to mounting devices on substrates and connecting by means of feedthrough holes.

BACKGROUND OF THE INVENTION

There are very few commonly used methods of attaching electronic devices onto circuit boards. The two most common methods used are wave solder and vapor phase/solder reflow processes. Both of these processes have their advantages and can normally be used with packaging styles, such as the Pinless Grid Array (PLGA). The PLGA is a packaging style, which uses coupling feedthrough technology for attaching electronic devices to circuit boards.

Surface attachment of components is gaining favor in this country, because it facilitates greater miniaturization of electronic equipment. There is constant pressure on the industry to reduce the size of electronics within any given device. The utilization of surface attached components will, in almost all instances, reduce the overall size of the circuit.

The cost of printed wiring interconnection is becoming an increasingly larger percentage of the finished value of electronic equipment. Interconnect costs have an effect similar to miniaturization. In an effort to reduce board costs, size reductions are being undertaken, which leads back to the use of surface attached chip components and devices to further aid in reducing size.

Surface attachment techniques eliminate insertion holes, which also reduce board size and eliminate some manufacturing problems. However, through holes or vias are still required in order to interconnect different layers or surfaces. It is quite likely that through hole count will increase, because the potential for internal connections formerly achieved with the component lead is lost in the surface attachment configuration.

The progress toward miniaturization has resulted in the further decrease in the size of through holes. This significant reduction in the size or diameter of the through holes has resulted in the inability to obtain feedthrough solder coupling in a conventional manner.

In the conventional well wave soldering process, electrical components are placed on the top of a board or substrate, and the bottom of the board is contacted with a wave of molten solder. The molten solder flows up through the through holes and establishes a feedthrough connection. However, solder is too viscous to flow through the very small diameter (micro or miniature) holes that are desired in today's electronic board construction. This problem can be overcome in some cases by reducing the flux density of the solder. However, in many cases, the feedthrough diameter is so small that no amount of flux balancing will be effective to establish a flow through the hole.

An example of a prior art coupling feedthrough is illustrated in FIG. 1. A through hole coupling through multiple layers of material is shown, which couples internal and external conductors on two or more of the layers. In the illustrated embodiment for example, a circuit board 12 includes a through hole 14 and a conductive pad 16 on one surface thereof. A layer of solder inhibitor 18 is disposed between the circuit board 12 and an insulator 20, which also has a through bore 22. A single or multiple layer substrate 24 is disposed adjacent insulator layer 20 and may contain one or more internal traces 26 and 28. An insulator layer 30 sandwiches the substrate between it and insulator layer 20. Insulator layer 30 similarly has a through bore 32. A conductive pad 34 may also be on the upper surface of insulator layer 30 and may connect to one or more conductors 36.

In the prior art approach to interconnecting the layers, the through bores 14, 22 and 32 are aligned and are of such diameter that placement of the substrate in contact with a standing wave of solder will result in the solder being pulled, or flow by capillary action, through the through bores, forming a conductive plug of solder 38. The through bores may or may not be pre-metallized as desired. By the prior art technique, the through bores are typically pre-metallized by a thin layer of solder 40 prior to forming a through connection. By the prior art technique, the diameter D of the through holes is sufficient that the solder will flow through the hole and form the continuous conductive plug.

As pointed out above, solder will not flow through the smaller diameter (micro) through holes in this manner.

Accordingly, it is desirable that some means and method be available for solder coupling via miniature through holes.

The applicant has devised an apparatus or system and technique for forming a conductor through these miniature through holes that are too small for normal reflow or capillary action.

SUMMARY AND OBJECTS OF THE INVENTION

It is the primary object of the present invention to provide an improved system and method for coupling via miniature through holes.

In accordance with a primary aspect of the present invention, a system for coupling via miniature through holes comprises a source of solder for supplying an unlimited quantity of molten solder to one side of a substrate and a source of vacuum for applying a controllable differential pressure to the opposite side of the board for forcing a sufficient quantity of solder to enter the holes to fill them.

Another aspect of the invention includes a process of aligning through holes of a substrate and a component, providing a source of solder to one end of the through holes, and applying a controllable vacuum to the other end of the through hole for drawing solder into the through hole, forming a feedthrough coupling.

BRIEF DESCRIPTION OF THE DRAWING

The above and other objects and advantages of the present invention will become apparent from the following description when read in conjunction with the accompanying drawing wherein.

DETAILED DESCRIPTION OF A PREFERRED EMBODIMENT

Figure 1:
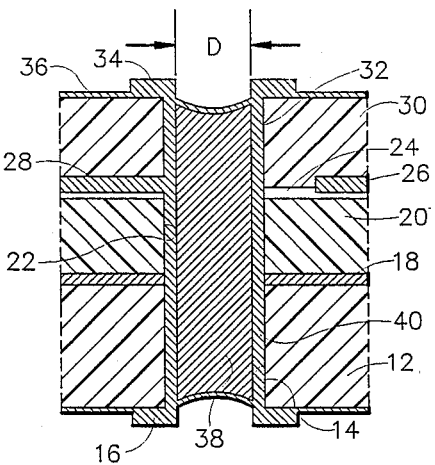
FIG. 1 is a side elevation view in section of a substrate illustrating a typical prior art coupling feedthrough.

Referring to FIG. 1 of the drawing, there is illustrated a feedthrough coupling formed in a conventional manner as discussed in the Background of the Invention and designated generally by the reference numeral 10.

Figure 2:
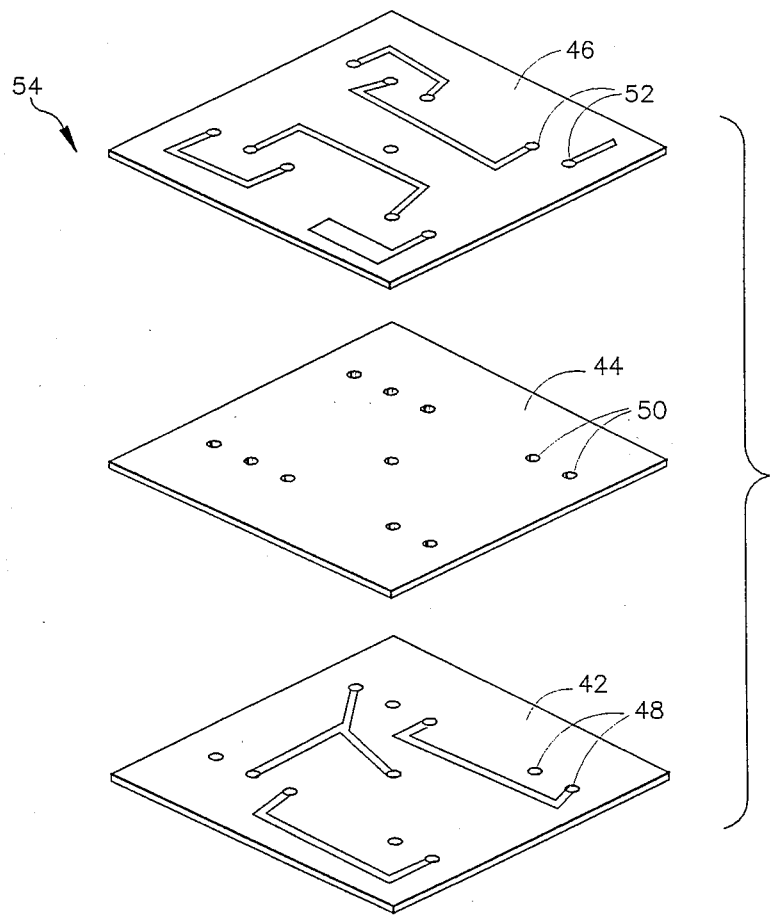
FIG. 2 is a perspective view illustrating a plurality of substrates or PC board layers to be electrically connected in accordance with the invention.

Referring further to the drawing, there is illustrated in FIG. 2 a plurality of substrates of any suitable construction to be secured together, with at least some through holes forming conductive paths between pads, leads or the like between the several substrates. By way of example, the substrates may be one or more PC boards, multi-layer PC boards, ceramic substrate or multi-layers of ceramic packages, or one or more ceramic packages on a PC board. The present system and method is envisioned for use particularly on high density printed circuit boards wherein leadless packages may be utilized and where high density, very small through holes are utilized.

A first substrate 42, a second layer or substrate 44 and a third layer or substrate 46 are shown in FIG. 2. These layers or substrates may each have one or more of a plurality of conductive paths as illustrated. The layers are designed to fit together, and are each provided with a plurality of micro through holes or bores having a diameter, for example, on the order of ten-thousandths of an inch or less in diameter. The bores are so small that solder will not flow through them in the conventional wave or reflow process.

In the structure as illustrated in FIG. 2, a pair of holes 48 in substrate 42 are to align with holes 50 in substrate 44 and again with holes 52 in substrate 46. Additional holes are illustrated, which similarly align through the three substrates.

Figure 3:
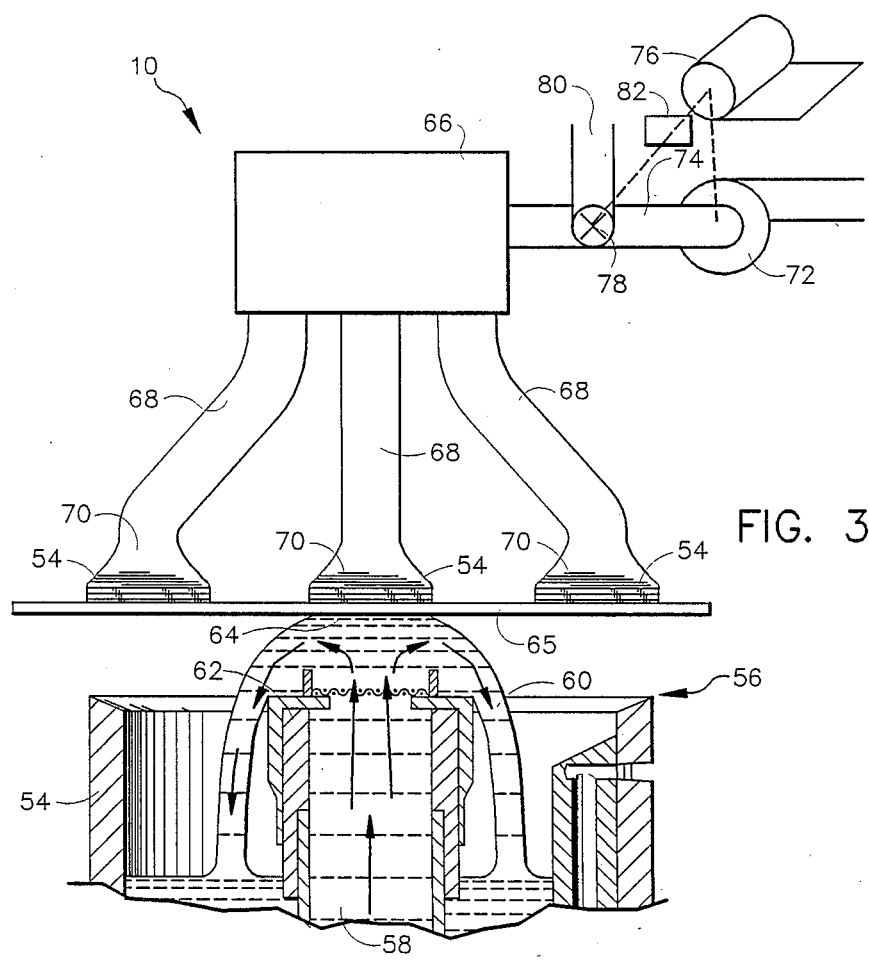
FIG. 3 is a schematic illustration of a system in accordance with the invention.
Figure 4:
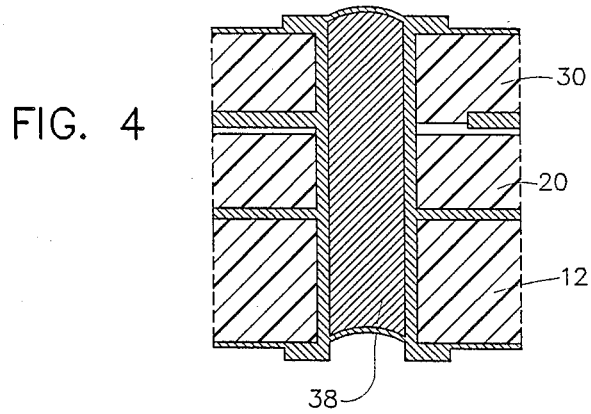
FIG. 4 is a view like FIG. 1 of a feedthrough coupling formed in accordance with the invention.

Referring to FIG. 3, an apparatus for carrying out the present process is schematically illustrated. A wave well designated generally by the numeral 56 is constructed in conventional manner and comprises a reservoir 58 for containing molten solder 60, which is flowed upward through a nozzle 62. The flow upward through the nozzle is accomplished by means of a pump (not shown), which creates a standing wave 64 above the nozzle through which circuit boards are passed in a process as will be described.

The solder is melted to a temperature of about three-hundred fifty to six-hundred fifty degrees Fahrenheit, and preferably in the range of from about four-hundred to five-hundred and fifty degrees. It is then pumped with a centrifugal pump up through nozzle 62, which may contain baffles and other structure to aid in creating a stable wave above the nozzle. The gently overflowing wave of solder flows back into the solder pot reservoir, from which it is re-circulated by pumping it up through the nozzle again.

A suitable conveyor 65 is positioned above the solder well for carrying stacks of substrates 54 having aligned through bores, as previously described and illustrated in FIG. 2. These substrates pass along the conveyor such that the undersurface thereof wipes or contacts the very top of the wave 64 as they pass over it. Only the underside of the substrate or bottommost surface typically engages the wave of solder. In a conventional arrangement, the solder typically bonds to leads and fluxed surfaces to form the necessary conductive paths. Similarly, it passes through the through holes to form conductive paths therein.

In the present arrangement with micro through holes, the solder will not flow through the holes by capillary action due to the viscosity of the solder as compared with the hole diameters. In order to remedy this, applicant has devised a system including a vacuum means having, as illustrated in FIG. 3, a vacuum header 66 with, for example, a plurality of elongated vacuum hoses 68 connected to vacuum nozzles 70. These vacuum nozzles are designed to fit the necessary portion of the substrates through which the solder is to be flowed.

The vacuum system is designed to and includes means for creating a ramping up and ramping down of the vacuum. A ramp up or ramp down drawing of the liquid solder through the through holes creates a homogenous bond therethrough. The system includes a typical vacuum pump 72 connected by a vacuum line 74 to common header 66 to which the vacuum leads 68 are connected. A motor 76 drives the vacuum pump 72 and also has mechanisms, including for example a reduction drive gear box 82 for operating valve 78 or the like for controlling the vacuum in the system. Operation of the valve opens and closes a vent intake 80 to thereby create the ramp up or ramp down vacuum in the system, which is applied to the substrate as it passes over the solder well or fountain. The specific details of construction of components of the system are not believed necessary. It is believed that construction of specific components, such as pump, motor, vacuum header, vacuum lines, and valves and the like are sufficiently well known to enable one with the subject specification at hand to construct and operate the system.

The vacuum on the upper side of the board should be just sufficient to draw the molten solder through the holes to the upper surface of the top board. Thus, the vacuum is ramped up (increased) to the required force to draw the solder up to the top and then immediately ramp down (decreased) to prevent drawing excess solder to the top of the board.

The system, therefore, comprises means in the form of the conveyor for supporting a substrate having micro miniature through holes with a solder well for supplying a continuous or essentially unlimited quantity of molten solder to one side of the substrate, a vacuum system for applying a differential pressure between the sides of the substrate for forcing a quantity of the solder into and through the through holes for filling the through holes and forming a conductive path or lead therethrough. The term "continuous supply," as related to the molten solder, means an amount in excess of the amount to fill the holes available during application of the vacuum to the other side of the micro through hole.

In accordance with the process of the present invention, one or more substrates are selected having micro miniature through holes, the through holes are aligned, and the substrates are supported while contacting one side of the substrate with a continuous supply of molten solder, and applying a differential pressure to the opposite side of the substrate for forcing a quantity of molten metal or solder into and through the through hole. The differential pressure is applied by applying a vacuum to the surface of the substrate opposite that of the molten solder. The step of applying the molten solder includes ramping the vacuum up and down to a level and at a rate that just pulls the desired quantity of the molten metal into the through hole for filling the through hole. The amount of vacuum and its duration can be easily ascertained without undue experimentation. The vacuum is controlled to prevent excess solder from being drawn through the through holes.

While I have illustrated and described my invention by means of a specific embodiment, it is to be understood that numerous changes and modifications may be made therein without departing from the spirit and scope of the invention as defined in the appended claims.

What is claimed is:

1. An apparatus for micro miniature feedthrough coupling of a substrate having an upper and a lower planar side and having micro through holes, said apparatus comprising:
   means for supporting said substrate;
   means for applying a continuous quantity of molten solder to only said lower planar side of said substrate; and
   means for applying a vacuum to said upper planar side of said substrate directly opposite said molten solder while it is applied to said lower planar side of said substrate, said vacuum forcing a quantity of said molten solder into said through holes for filling said through holes with a quantity of said molten solder.

2. The apparatus according to claim 1, wherein said means for applying said molten solder to said lower side of said substrate comprises a wave well.

3. The apparatus according to claim 1, wherein said means for supporting said substrate comprises a conveyer.

4. The apparatus according to claim 1, wherein said vacuum means includes means for applying a ramp up and ramp down of the level of said vacuum.

5. The apparatus according to claim 4, wherein said means for applying said molten solder to said lower side of said substrate comprises a wave well.

6. The apparatus according to claim 5, wherein said means for supporting said substrate comprises a conveyer.

7. An apparatus for establishing a feedthrough coupling via a micro through hole of a substrate having an upper and a lower planar side and a plurality of micro through holes, said apparatus comprising:
   means for supporting said substrate;
   wave well means for applying a continuous quantity of molten solder to only said lower planar side of said substrate; and
   vacuum means for applying a vacuum to said upper planar side of said substrate from directly opposite the molten solder while it is applied to said lower planar side of said substrate for forcing a quantity of said molten solder into said micro through hole for filling said micro through hole with a quantity of said molten solder.

8. The apparatus according to claim 7, wherein said means for supporting said substrate comprises a conveyer.

9. The apparatus according to claim 7, wherein said vacuum means includes means for applying a ramp up and ramp down of the level of said vacuum.

10. The apparatus according to claim 9, wherein said means for supporting said substrate comprises a conveyer.

* * * * *